US006821714B1

(12) United States Patent
Mescher et al.

(10) Patent No.: US 6,821,714 B1
(45) Date of Patent: Nov. 23, 2004

(54) LITHOGRAPHY PROCESS FOR PATTERNING HGI2 PHOTONIC DEVICES

(75) Inventors: Mark J. Mescher, Auburndale, MA (US); Ralph B. James, Livermore, CA (US); Haim Hermon, Jerusalem (IL)

(73) Assignee: Sandia National Laboratories, Livermore, CA (US)

( * ) Notice: Subject to any disclaimer, the term of this patent is extended or adjusted under 35 U.S.C. 154(b) by 843 days.

(21) Appl. No.: 09/712,082

(22) Filed: Nov. 13, 2000

(51) Int. Cl.$^7$ .................................................. G03F 7/00
(52) U.S. Cl. ...................... 430/318; 430/319; 430/321; 250/370.12
(58) Field of Search ............................... 430/318, 319, 430/321; 250/370.12

(56) References Cited

U.S. PATENT DOCUMENTS

| 5,227,635 A | * | 7/1993 | Iwanczyk | 250/370.12 |
| 5,677,539 A | * | 10/1997 | Apotovsky et al. | 250/370.13 |
| 5,892,227 A | * | 4/1999 | Schieber et al. | 250/370.12 |

* cited by examiner

Primary Examiner—John A. McPherson
(74) Attorney, Agent, or Firm—Timothy P. Evans

(57) ABSTRACT

A photolithographic process forms patterns on HgI$_2$ surfaces and defines metal sublimation masks and electrodes to substantially improve device performance by increasing the realizable design space. Techniques for smoothing HgI$_2$ surfaces and for producing trenches in HgI$_2$ are provided. A sublimation process is described which produces etched-trench devices with enhanced electron-transport-only behavior.

34 Claims, 2 Drawing Sheets

FIG. 1A-1E

Mercuric iodide after various processing steps: (1A) lithography on Pd to define grid etch pit. (1B) etching of Pd. (1C) HgI$_2$ sublimation etch (300 μm). (1D) lithography for grid and collecting electrodes. (1E) after Pd etching.

LITHOGRAPHY PROCESS FOR PATTERNING HGI2 PHOTONIC DEVICES

The United States Government has rights in this invention pursuant to Contract No. DE-AC04-94AL85000 between the United States Department of Energy and Sandia Corporation for the operation of Sandia National Laboratories.

BACKGROUND OF THE INVENTION

1. Field of the Invention

The present invention relates to methods for obtaining improved spatial and energy resolution in room temperature $HgI_2$ radiation detectors, and more specifically, it relates to a method for lithographically patterning $HgI_2$ crystals.

2. Description of Related Art

Semiconductor materials exhibit a band gap between their valence and conduction bands of typically a few eV. Because this energy gap is so low, as the temperature of the crystal is increased, electrons are thermally excited and easily move from the valence band to the conduction band. The electrical properties of these materials, therefore, are affected not only by the movement of electrons into the conduction band but also by the formation of vacant sites or "holes" in the valence bands left behind by the departing electrons. Both can conduct current.

Holes also may be created by the interaction of energetic radiation, such as X-rays, gamma rays, and the like, with intrinsic semiconductors and therefore one should be able to use these materials as detectors for measuring high-energy radiation. In fact, high-resistivity semiconductor radiation detectors are widely used for detecting ionizing radiation due to their ability to operate at room temperature, their small size and durability. Such detectors are used in a wide variety of applications, including medical diagnostic imaging, nuclear waste monitoring, industrial process monitoring, and space astronomy. Ionizing radiation includes both particulate radiation such as alpha or beta particles and electromagnetic radiation, such as gamma or x-rays.

If all the electrons and holes generated by the ionizing radiation reach their respective electrodes (i.e., the electrons reach the anode and the holes reach the cathode), the output charge signal will exactly equal the charge from the ene deposited within the crystal by the radiation. Because the deposited charge is directly proportional to the energy of the ionizing radiation, the semiconductor detector provides a means for measuring the energy of the ionizing radiation.

Room temperature detectors, however, suffer from a serious drawback. Because of limitation in the transport properties of the bulk semiconductor crystal, some of the electrons and, more particularly, some holes are generally lost by being trapped as they move toward the respective electrodes under the influence of the external electrical field. This is particularly evident for semiconductors wherein the transport properties of one carrier type (e.g., electrons) are much better than those of another type (in this example the "holes"). Therefore under such circumstances the amplitude of the output charge signal becomes dependent on the position within the crystal at which the ionizing radiation is absorbed. Generally speaking, the amplitude is less than the charge deposited by the ionizing radiation and results in a corresponding reduction of energy measurement accuracy, poor resolution, and reduced peak efficiency. This loss (or trapping) of charge in a radiation detector results in distorted and asymmetrical spectral peak shapes known as "hole tailing" or "hole trapping."

The inability to eliminate "hole" drift current is a major impediment for the use of room temperature semiconductors as detectors. Gamma-ray spectroscopy is particularly encumbered because pulse height spectra produced by these devices are distorted by this process. Mono-energetic gamma rays produce charge signal responses of different pulse height because the total combined distance drifted by the electrons and holes is dependent on the position of gamma-ray interaction. This phenomenon is well known in the prior art and has been described by many researchers. It is widely understood to be the major deficiency limiting the effectiveness of room temperature semiconductor materials.

Due to the deleterious effects of hole-trapping in semiconductor detectors, much effort has gone into attempting to solve this problem. U.S. Pat. Nos. 4,253,023 and 4,996,432 recognized the problem and proposed early remedies. The first of these included a method to de-convolute the contribution of the electron motion from the acquired signal. The second approach proposes a method relying upon use of a thick crystal and a crystal orientation placing the detector anode surface facing the source of radiation, thereby reducing the positional dependence of the radiation interaction with the crystal and restricting it only to that part of the crystal immediately behind the anode. Neither of these approaches directly addresses the problem of eliminating hole-trapping.

U.S. Pat. No. 5,677,539 provides another approach and a comprehensive review of much of the pertinent prior art. A particularly relevant approach, described therein, employs an anode patterned into an interleaving grid structure, with the, cathode remaining planar. (See, e.g., P. N. Luke, "Unipolar Charge Sensing with Coplanar Electrodes—Application to Semiconductor Detectors," IEEE Tran. Nucl. Science, vol. 42, No. 4, at pages 207–213 (1995)). In this approach, one set of anode grids is maintained at a slightly higher voltage than the other. A train of signal conditioning electronics is connected to each set of grids, and the difference between the outputs from these trains constitutes the final output signal. With this arrangement, when the charge cloud is far from the grids, the difference-signal between the grid outputs is zero. As the cloud approaches the grids, the induced charge on one grid rises rapidly, while the charge induced in the other grid drops rapidly. The difference signal is then a measure of the full charge in the electron cloud, independent of the position of the ionizing event.

This approach, however, also suffers from various drawbacks. First, the grid structure is relatively complex and would be difficult, if not impossible, to use in detector arrays. Second, the grids require two separate amplifying chains, plus a difference amplifier, adding significantly to the complexity and cost of manufacture. This circuitry also would be difficult to implement in the multichannel type integrated circuits needed in detector array structures.

A relatively simpler structure is a variation on a technique devised by Frisch for use in gas detectors. The hole-trapping phenomenon observed in semiconductor detectors is analogous to the trapping behavior of positive ions in gas detectors. Frisch proposed, and later developed, detectors that contained a grid of conductive wires between the two electrodes of a conventional gas detector.

In the Frisch grid type detector, the signal is measured between the anode and the grid. The negative charge carriers, electrons in the case of a semiconductor detector, usually drift all of the way to the anode. Thus, any radiation interactions occurring between the cathode and the grid will produce electrons that drift past the grid and on to the anode.

When the electrons drift across the gap between the grid and the anode, they will induce a current that is due solely to the motion of electrons. The current induced by positively charge carriers ("holes" in the case of semiconductors) traveling in the opposite direction is shielded by the grid. The main advantage, then, of the Frisch grid is that the signal produced from the device is independent of the position of interaction between the cathode and grid (completely solving the hole trapping problem in the cathode to grid region).

An approach to reducing hole-trapping in a semiconductor detector using a modified Frisch grid approach has been proposed by D. S. McGregor. McGregor's scheme, described as an "etch trench" device, entailed building a Frisch Grid device on a semiconductor crystal and placing electrodes at the bottom of these trenches. The primary disadvantage of McGregor's etch-trench design is that it is difficult to execute. In other words, it might be very difficult to produce the requisite trenches, particularly since the fabrication technology for room temperature semiconductor materials is not well developed at this time. Therefore, while a Frisch-grid type device design would work very well in a room temperature semiconductor detector, it suffers from the fundamental drawback of being difficult to construct. Such a device, owing to the difficulty of placing a conductive grid inside a semiconductor crystal would be inherently complex and expensive.

A third approach is discussed in U.S. Pat. No. 5,677,539. This invention takes advantage of the principle that a significant reduction in tailing in a semiconductor detector can be attained by a novel arrangement of electrodes that share induced charge from ionizing events in the detector, that properly shape the electric field, and that focus charge collection toward a small electrode.

The detector includes three electrodes formed on the surface of a semiconductor crystal. The crystal has a plurality of sides; it preferably has a thickness of at least about 0.5 mm and is preferably formed from a semiconductor material having a higher mobility-lifetime product for one electronic charge carrier compared to the other. The first electrode is a bias electrode, which preferably covers the entire surface of one side of the crystal. At least one signal electrode having a small area is preferably formed on the opposing side of the crystal from the bias electrode. A control electrode is preferably disposed on the same side containing the signal electrode.

In particular, the control electrode is formed on the same side of the semiconductor crystal as the signal electrode (anode), and the bias electrode (cathode) covers substantially the entire surface of the opposite side of the crystal. The semiconductor crystal is formed from CdZnTe or CdTe. In the simplest configuration, the anode is a small contact point located near the center of the electron-charge-collection side of the crystal. The anode is coupled to ground through a large-value resistor and to external signal circuitry. The cathode is coupled to a voltage source that maintains the cathode at a negative voltage level relative to the anode. Preferably, the control electrode is much larger in area than the anode and forms a single ring surrounding the anode. The control electrode is maintained at a voltage level that is negative with respect to the anode, but generally not more negative than the cathode.

This approach relies on a geometric construction of the various electrodes to shape the electric field within the crystal in order to direct and accelerate the more mobile of the charge carriers toward the appropriate collecting electrode.

By operating in this manner the less mobile of the charge carriers, those that are "trapped", arrive typically too late to contribute to the analysis. However, while much reduced, some small percentage of these carriers still do contribute to the signal.

The performance of gamma-ray and x-ray spectrometers fabricated from $HgI_2$ is substantially limited by hole trapping. The ability to pattern arbitrarily sized and positioned electrodes allows for enhanced performance via the so-called "electron-only" behavior, which substantially increases detector energy resolution. Hole trapping distorts the current pulse generated by the absorption of an x- or gamma-ray, which reduces the ability of the detectors to spectrally resolve the unique radiological emissions of a wide variety of isotopes. Degradation in the capability of the spectrometers to resolve energies of x-rays and gamma-rays reduces the marketability of the devices.

For imaging devices, the spatial resolution is limited by the pixel size of each individual detector element. It is desirable that pixel size be significantly decreased as compared to the current method of shadow mask deposition. The ability to pattern substantially denser arrays of smaller pixels will improve the spatial resolution of these imaging devices.

SUMMARY OF THE INVENTION

It is an object of the present invention to provide a method using a photolithographic process for forming patterns on $HgI_2$ surfaces.

It is another object of the present invention to provide a method for smoothing $HgI_2$ surfaces.

Still another object of the present invention is to provide a method for producing trenches in $HgI_2$.

It is another object of the present invention to provide a sublimation process for trench etching to produce etched-trench devices with enhanced electron-transport-only behavior.

Another object of the invention is to provide a lithographic process for defining a metal sublimation mask and electrodes to substantially improve device performance by increasing the realizable design space.

These and other objects of the invention will be apparent to those skilled in the art based on the teachings herein.

The invention patterns $HgI_2$ surfaces with a new photolithographic process. The process is used to define metal sublimation masks and electrodes on $HgI_2$. Design space is increased to substantially improve device performance. Techniques for smoothing $HgI_2$ surfaces and for producing trenches in $HgI_2$ are provided. A sublimation process is described which produces etched-trench devices with enhanced electron-transport-only behavior.

To deposit a continuous Pd (or other metal) film on a given substrate (e.g. mercuric iodide), the film thickness must be about as thick as (or greater than) the surface roughness. Rapid agitation of the etch solution produced smooth surfaces. The invention provides agitation parameters that produce optimal smoothness.

Materials used for both electrode and sublimation mask metal layers include palladium, gold, carbon, indium-tin-oxide, chromium, tantalum and platinum. The films are deposited using techniques such as sputtering and electron beam deposition. Although sputtering will generally not cause substrate heating above 50–100° C. for plasma powers less than 200 W, it was necessary to cool the substrate to optimize adhesion.

Shadow masks are typically used to pattern $HgI_2$ because acetone and/or other solvents used to remove the photoresist after patterning attack $HgI_2$ rapidly. $HgI_2$ cannot withstand the high temperatures typically required for photoresist baking. Shadow masks, however, are quite limiting in terms of minimum pattern size and freedom of design. Fine line widths of guard electrodes are required for electron-only operation of $HgI_2$ spectrometers, and shadow masks are often not suitable for generating them.

The present invention provides a new lithography process that is compatible with $HgI_2$. A low-temperature photoresist is employed in the new process. Solvents are not used for dissolving the photoresist after the metal etching step. A high-temperature bake was not used. The palladium etchant was chosen such that a soft-bake was sufficient to make the photoresist a suitable mask for the Pd etch step. Without the hardbake step, the photoresist removal can subsequently be promoted by a flood exposure step after the Pd etching.

Trenches were etched by a sublimation process after the first Pd metallization and patterning steps. In the present invention, sublimation is governed by temperature only and not by gas flow as long as the pressure is kept somewhat below 11 mTorr. In addition to being temperature dependent, the sublimation rate was also found to be dependent on the particular etchant used for the Pd patterning, with an increase in Br content generating higher etch rates and a redder surface. After the sublimation step was completed, the entire surface was metallized again and patterned with collection and grid electrodes.

BRIEF DESCRIPTION OF THE DRAWINGS

FIG. 1A shows lithography on Pd to define grid etch pit.

FIG. 1B shows etching of Pd.

FIG. 1C shows $HgI_2$ sublimation etch (300 $\mu$m).

FIG. 1D shows lithography for grid and collecting electrodes.

FIG. 1E shows mercuric iodide after Pd etching.

DETAILED DESCRIPTION OF THE INVENTION

Figure 1A:
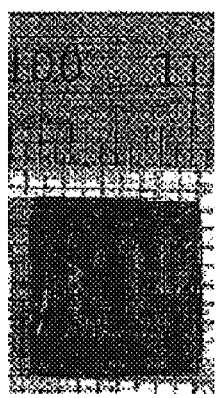
FIGS. 1A through 1E show mercuric iodide after various processing steps.

The invention provides a photolithographic process for forming patterns on $HgI_2$ surfaces and for defining metal sublimation masks and electrodes to substantially improve device performance by increasing the realizable design space. Techniques for smoothing $HgI_2$ surfaces and for producing trenches in $HgI_2$ are provided. A sublimation process is described which produces etched-trench devices with enhanced electron-transport-only behavior.

Surface Preparation

An improvement in surface preparation was required in order to be able to deposit a Pd electrode layer (or other material such as gold or platinum) onto mercuric iodide that could be patterned to $\mu$m level dimensions. In order to deposit: a continuous film on a given substrate, it is necessary that the film thickness be approximately as thick as (or greater than) the surface roughness. Since film thickness is limited to several thousand angstroms due to stress-related delamination problems, the surface roughness should be less than 1000 Å. Experimentation using a standard procedure to prepare aged $HgI_2$ samples for processing revealed surface roughnesses considerably larger than this. The standard for etching aged $HgI_2$ crystals (which are typically iodine deficient) is typically a 2–5 minute etch in a 5–10% solution of KI in $H_2O$. This will generate a nearly stoichiometric surface, but with large surface roughness (Table 1). It was found that rapid agitation of the etch solution produced considerably smoother surfaces. It is supposed here that the etching mechanism is transport-limited without, agitation, and thus large gradients in the etchant and etch-byproduct concentrations could exist along the surface of the crystal due to non-uniform stoichiometry and thus local etch rate. This could generate surface roughness. If agitation is used to increase the transport rate, these concentration gradients are limited to much smaller distances which should effectively make the etch rate more uniform and thus decrease surface roughness. Table 1 shows surface roughnesses measured by a Dektak profilometer for various etching conditions. Roughly one order of magnitude decrease in surface roughness can be achieved with the: proper agitation level (conditions shown in Table 2).

TABLE 1

Measured surface roughness for various etching conditions of aged $HgI_2$ crystals

| Sample condition | Surface roughness [Å] |
| --- | --- |
| aged, no etch | 4900 |
| acetone no agitation | 2800 |
| 1:10 KI:$H_2O$, no agitation | 5000 |
| 1:10 KI:$H_2O$, slow agitation (100 rpm) | 620 |
| 1:10 KI:$H_2O$, fast agitation (200 rpm) | 320 |

TABLE 2

Conditions used for optimal surface etch treatment.

| Etch solution | time | Sample nutation sequence | agitation | rinse | dry |
| --- | --- | --- | --- | --- | --- |
| 1:10 KI/$H_2O$ | 30 s 4× | 180°, 90°, 180° | 200 rpm (stir bar) | $H_2O$ | $N_2$ |

Metal Deposition

Palladium, which is typically used as the electrode material for mercuric iodide, was used for both electrode and sublimation mask metal layers. Other usable materials include gold, carbon, indium-tin-oxide, chromium, tantalum, and platinum. The films were sputtered using a DC magnetron source because of the low temperatures that can be maintained relative to evaporation. Other film deposition techniques, such as electron beam deposition, may be used. Two aspects of the sputtering process are of primary importance. First, a low base pressure of the system before deposition is important for good film adhesion (adhesion was qualitatively determined by fractional metal coverage after the lithography step). High vacuum at room temperature induces enough sublimation that good surface stoichiometry is insured. Second, substrate temperature must be kept low to obtain good film adhesion. Although sputtering will generally not cause substrate heating above 50–100° C. for plasma powers less than 200 W, it was necessary to cool the substrate to optimize adhesion. A two-stage Peltier cooler was used to maintain a substrate temperature of −15° C. Deposition conditions are shown in Table 3.

TABLE 3

Sputtering conditions for Pd metallization on mercuric iodide.

| Air Pressure | Power | Deposition Rate | Substrate Temperature | Target-Substrate Spacing | Deposition Time | Base Pressure |
|---|---|---|---|---|---|---|
| 5.0 mTorr | 100 W D.C. | 700 Å/min | −15° C. | 8.0 cm | 2.0 min | <1 × $10^{-6}$ Torr |

Lithography for Pd Patterning on $HgI_2$

Shadow masks are typically used to pattern Pd (or other materials such as gold and platinum) on $HgI_2$ because typical lithography processes present two major problems. First, acetone and/or other solvents are used to remove the photoresist after patterning. Many solvents, including acetone, however, attack $HgI_2$ rapidly. Second, $HgI_2$ cannot withstand the high temperatures typically required for photoresist baking. Shadow masks, however, are quite limiting in terms of minimum pattern size and freedom of design. Fine line widths of guard electrodes are required for electron-only operation of $HgI_2$ spectrometers, and shadow masks are often not suitable for generating them.

As a result, a new lithography process was developed which is compatible with $HgI_2$. A low-temperature photoresist (requiring a moisture-removal bake of only 50° C.) was employed in the new process. Second, the required use of standard solvents for dissolving the photoresist after metal etching was circumvented. This was achieved through two steps. First, a high-temperature bake, which typically polymerizes a photoresist and makes it impervious to a developer solution, was not used. The palladium etchant was chosen such that a soft-bake was sufficient to make the photoresist a suitable mask for the Pd etch step. Without this hardbake step, the photoresist removal can subsequently be promoted by a flood exposure step after the Pd etching. The flood exposure makes the photoresist soluble in the standard developer solution of 2:1 $TMAH:H_2O$, which does not attack mercuric iodide. The processing steps and materials used are shown in Table 4.

TABLE 4

Lithography steps for Pd metallization patterning

| Step | Parameters | Chemical |
|---|---|---|
| Spin adhesion promoter on $HgI_2$ | 3000 rpm, 20 sec | HMDS |
| Spin photoresist on $HgI_2$ | 3000 rpm, 20 sec, 13 μm thick | OCG 825 |
| Soft-bake | 90° C., 2 min, (50° C. max temp reached) | |
| Mask alignment, exposure | 200 W Hg lamp, 1.8 min exposure | |
| Develop photoresist | 50 sec, $H_2O$ rinse, $N_2$ dry | 2:1 $TMAH:H_2O$ |
| Soft-bake | 90° C., 2 min | |
| Pd etch | 1 min | 2:10:30 $Br:HNO_3:HCl$ |
| Flood exposure | 200 W Hg lamp, 2.5 min exposure | |
| Photoresist removal | 2 min, $H_2O$ rinse, $N_2$ dry | 2:1 $TMAH:H_2O$ |

Sublimation

Trenches were etched by a sublimation process after the first Pd metallization and patterning steps. The vapor pressure of $HgI_2$ below its structural transformation temperature of 129° C. is less than 11 mTorr. Therefore, sublimation should be governed by temperature only and not by gas flow as long as the pressure is kept somewhat below 11 mTorr. As a result, a single zone quartz furnace with liquid nitrogen vapor trap that was turbo-pumped to a pressure of 3 mTorr was sufficient for trench etching. The temperature outside of the furnace tube (but inside the heater housing) was monitored and the average temperature in the furnace over a 20 minute interval was estimated to be approximately 95–120° C.

In addition to being temperature dependent, the sublimation rate was also found to be dependent on the particular etchant used for the Pd patterning, with an increase in Br content generating higher etch rates and a redder surface. (One possible explanation is that Br in the Pd etchant solution prevents the mercuric iodide from losing excessive iodine and thus making the surface more red. Because iodine has a higher vapor pressure than mercury under these conditions, an increased sublimation rate is obtained.) Without Br, the surface was dark (typical of Hg-rich surfaces) and it sublimed at a slower rate.

Figure 1B:
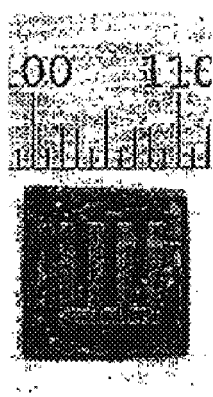
Figure 1C:
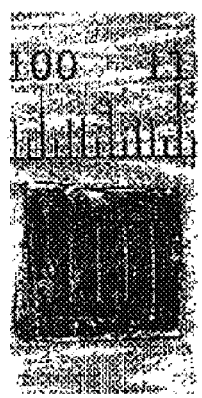
Figure 1D:
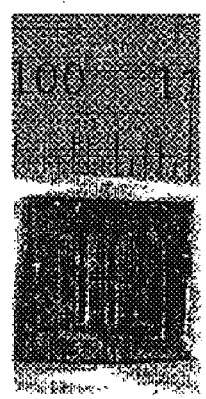
Figure 1E:
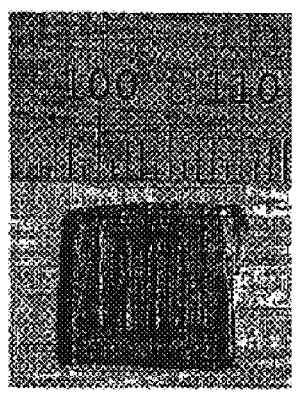

After the sublimation step was completed, the entire surface was metallized with Pd again and then patterned with collection and grid electrodes having the dimensions shown in Table 5. Photographs of a fabricated device are shown at various stages of the fabrication process in FIGS. 1A–1E. FIG. 1A shows lithography on Pd to define a grid etch pit. FIG. 1B shows etching of Pd. FIG. 1C shows $HgI_2$ sublimation etch (300 μm). FIG. 1D shows lithography for grid and collecting electrodes. FIG. 1E shows mercuric iodide after Pd: etching.

Figure 2:
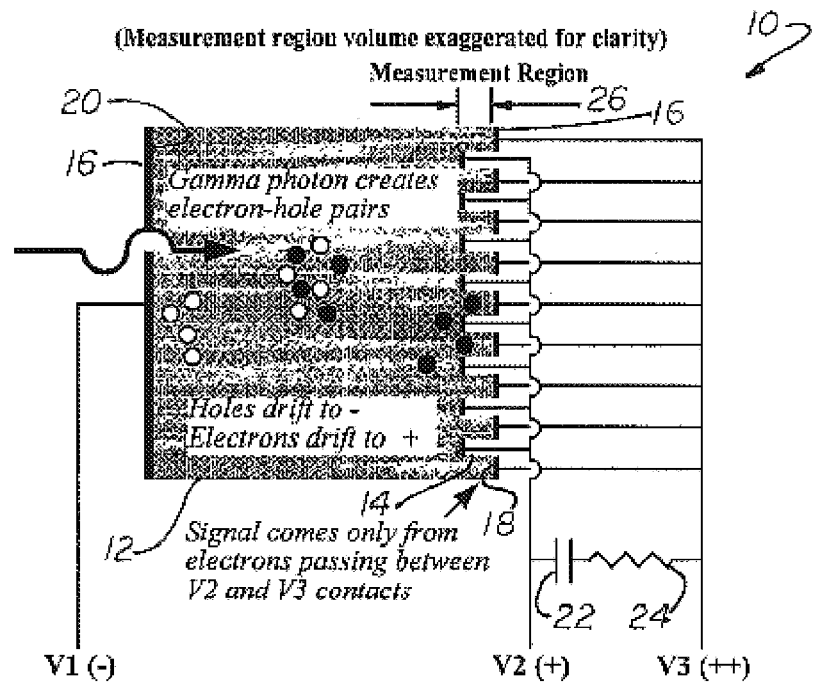
FIG. 2 shows a schematic cross-sectional diagram for an example single-carrier device where the sensor signal comes from the contacts measuring just the electron current.

FIG. 2 shows the basic structure of a coplanar grid gamma-ray detector 10 of the present invention. $HgI_2$ crystal 12 has been fabricated with trenches 14. Electrode material 16 (e.g., palladium, gold or platinum) has been deposited into the trenches as well as onto the adjacent outer wall 18 and the opposite wall 20. The detector is electrically biased such that the electrodes on the outer wall 18 are at the most positive potential, and the electrodes within the trenches 14 are at a less positive potential, while the electrode on the wall 20 is at a potential that is negative with respect to the potential at wall 18 and within trenches 14. A capacitor 22 and resistor 24 in series may be used to isolate the electrodes on wall 18 from the electrodes within trenches 14. In operation, radiation (such as a gamma photon) creates electron-hole pairs. The holes drift in the direction of the negative potential at wall 20 and the electrons drift to the positive potentials at the trenches and the more positive potential at the outer wall 18. The detector signal is read only from electrons passing between the electrodes in trenches 14 and the electrodes on the outer wall 18 within the measurement region 26. The wires may be attached to each set of said metal layers using material carbon Aquadag or another colloidal suspension of graphite particles. Aquadag is a trade name for a colloidal suspension of graphite in water, generally used as a lubricant and a conductive coating.

TABLE 5

| Dimensions used for fabrication of $HgI_2$ electron-only spectrometer. | | | | |
|---|---|---|---|---|
| Collection width | Grid width | Collection length | Pit width | Pit depth |
| 600 μm | 400 μm | 6.0 mm | 1000 μm | 300 μm |

The present invention is technically different in both the equipment required and the potential achievable performance. Standard lithography equipment is required, because it provides the capability to achieve smaller electrode feature sizes and electrodes that are more closely spaced. Etched trench devices are not currently realized in commercial $HgI_2$ spectrometers and thus the sublimation process provides a new and different capability to fabricate such devices.

The lithography is an improvement because (as an optical method) much finer feature sizes can be obtained than with commonly used shadow mask techniques, allowing for enhanced ability to localize gamma-ray interactions, engineer the internal electric field in the devices, and generate higher quality images of shaped radiation sources.

The sublimation adds additional design freedom and consequently performance. Currently there are no commercial methods for generating fine-line cross-strip imaging arrays, fine-line coplanar grids, small pixels having a small pitch, or etched trench detectors of $HgI_2$. Implementation of the new processing steps leads to x-ray and gamma-ray spectrometers with both improved spatial imaging capability and energy resolution.

Industrial suppliers will use this new process for fabricating $HgI_2$ x-ray and gamma-ray and charged-particle spectrometers for medical imaging, environmental monitoring, baggage handling, and materials sorting applications. The government will use $HgI_2$ detectors and instruments utilizing these sensors to detect nuclear smuggling, safeguard dismantled nuclear materials, search for nuclear weapons, verify treaty compliance, locate unexploded ordnance, detect contraband drugs, perform forensic analyses, conduct x-ray astronomy, clean up waste sites, and act as personal dosimeters.

The primary cost of $HgI_2$ radiation detectors is in the crystal growth and secondarily, fabrication. Standard lithography equipment, evacuated furnaces, and sputtering equipment are required for current process. It is estimated that these additional fabrication systems would represent less than 20% of total production cost.

The foregoing description of the invention has been presented for purpose of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. A method of lithographically patterning a metal deposited onto a $HgI_2$ crystal, comprising the steps of:
   depositing a metal layer onto a $HgI_2$ crystal surface;
   spinning adhesion promoter onto said metal layer;
   spinning photoresist onto said adhesion promoter;
   soft-baking said photoresist to remove moisture;
   aligning a mask to said photoresist;
   exposing a portion of said photoresist that is not concealed by said mask to produce exposed photoresist and unexposed photoresist;
   removing said mask from said photoresist;
   developing and removing said exposed photoresist;
   soft-baking said photoresist a second time;
   etching said metal layer;
   flood exposing said unexposed photoresist to produce a second exposed photoresist; and
   developing and removing said second exposed photoresist.

2. The method of claim 1, wherein said metal layer comprises metal selected from the group consisting of palladium, gold, carbon, indium-tin-oxide, chromium, tantalum and platinum.

3. The method of claim 1, wherein the step of spinning adhesion promoter is carried out with HMDS at about 3000 rpm for about 20 seconds.

4. The method of claim 1, wherein the step of spinning photoresist is carried out until said photoresist is about 1.3 μm thick.

5. The method of claim 1, wherein the step of soft-baking said photoresist to remove moisture is carried out at about 90° C. ambient temperature for about 2 minutes, wherein said photoresist temperature does not exceed 50° C.

6. The method of claim 1, wherein the step of exposing said photoresist is carried out at about 200 W with a Hg lamp at an exposure time of about 1.8 minutes.

7. The method of claim 1, wherein the step of developing said photoresist is carried out with a mixture of about 2:1 $TMAH:H_2O$ for about 50 seconds followed by rinsing with $H_2O$ and drying with $N_2$.

8. The method of claim 1, wherein said metal layer comprises palladium, wherein the step of etching said metal layer is carried out with a mixture of about 2:10:30 of $Br:HNO_3:HCl$ for about 1 minute.

9. The method of claim 1, wherein the step of flood exposing said unexposed photoresist is carried out with about 200 W from a Hg lamp at an exposure time of about 2.5 minutes.

10. The method of claim 1, wherein the step of developing and removing said second exposed photoresist is carried out with a mixture of about 2:1 of TMAH: $H_2O$ for about 2 minutes followed by rinsing with $H_2O$ and drying with $N_2$.

11. The method of claim 1, wherein the step of developing and removing said second exposed photoresist will produce uncovered $HgI_2$, the method further comprising subliming said uncovered $HgI_2$ to produce trenches.

12. The method of claim 11, wherein said $HgI_2$ crystal is held at a vacuum pressure that is less than 11 mTorr, wherein sublimation is governed by temperature of the $HgI_2$ surface.

13. The method of claim 12, wherein said vacuum pressure is about 3 mTorr and said temperature is within a range of about 95–120° C.

14. The method of claim 11, further comprising depositing metal into said trenches.

15. The method of claim 1, further comprising smoothing said $HgI_2$ crystal surface prior to the step of depositing a metal layer.

16. The method of claim 15, wherein the step of smoothing said $HgI_2$ crystal surface further comprises:
   placing said $HgI_2$ crystal into a solution of $KI:H_2O$; and
   agitating said solution.

17. The method of claim 16, wherein said $KI:H_2O$ is at a mixture of about 1:10.

18. The method of claim 16, where the KI in said solution is about 5% to 15% of said solution.

19. The method of claim 16, further comprising agitating said solution at an agitation rate within a range from about 100 rpm to about 200 rpm.

20. The method of claim 16, wherein the step of agitating said solution comprises (i) agitating said solution in a mixture of about 1:10 of KI:H$_2$O at about 200 rpm with a magnetic stir bar for about 30 seconds at each orientation of 0°, 180°, 270° and 90°, (ii) rinsing said crystal with H$_2$O and (iii) drying said crystal with N$_2$.

21. The method of claim 1, wherein the step of depositing a metal layer comprises sputtering metal onto said HgI$_2$ crystal surface.

22. The method of claim 1, wherein the step of depositing metal is carried out with a metal deposition technique selected from the group consisting of metal sputtering and metal evaporation.

23. The method of claim 22, wherein said HgI$_2$ crystal is placed in a vacuum prior to metal deposition, wherein said vacuum comprises a low base pressure.

24. The method of claim 22, wherein said HgI$_2$ crystal is cooled to promote metal adhesion.

25. The method of claim 24, wherein said HgI$_2$ crystal is cooled to a temperature of about −15° C.

26. The method of claim 25, wherein said HgI$_2$ crystal is cooled with a two-stage Peltier cooler.

27. The method of claim 23, wherein said low base pressure is less than about 1×10$^{-6}$T.

28. The method of claim 21, wherein the step of sputtering metal onto said HgI$_2$ surface further comprises:

placing said HgI$_2$ crystal into a vacuum chamber having a base pressure of less than about 1×10$^{-6}$T;

cooling said HgI$_2$ crystal to about −15° C.;

filling said vacuum chamber with a working gas for sputtering; and depositing metal onto said HgI$_2$ crystal surface.

29. The method of claim 28, wherein said working gas for sputtering comprises Ar at about 5 mTorr.

30. The method of claim 28, wherein said metal is deposited at a rate of about 700 Å/minute for about 2 minutes.

31. The method of claim 28, wherein the step of depositing metal comprises depositing palladium.

32. The method of claim 1, further comprising attaching wires to said metal layer, wherein said wires are for applying electrical voltages and providing electrical connection to signal conditioning electronics.

33. The method of claim 32, wherein said wires are attached to said metal layer using a colloidal suspension of graphite particles.

34. The method of claim 1, further comprising depositing insulating material onto said HgI$_2$ crystal surface and said metal layer.

* * * * *